United States Patent
Arao

(10) Patent No.: US 7,157,317 B2
(45) Date of Patent: Jan. 2, 2007

(54) MANUFACTURING METHOD FOR FIELD-EFFECT TRANSISTOR

(75) Inventor: Tatsuya Arao, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/844,143

(22) Filed: May 12, 2004

(65) Prior Publication Data

US 2004/0209412 A1 Oct. 21, 2004

Related U.S. Application Data

(62) Division of application No. 10/284,275, filed on Oct. 30, 2002, now Pat. No. 6,737,302.

(30) Foreign Application Priority Data

Oct. 31, 2001 (JP) .............................. 2001-333724

(51) Int. Cl.
H01L 21/84 (2006.01)
(52) U.S. Cl. ...................... 438/151; 438/164
(58) Field of Classification Search ................ 438/151
See application file for complete search history.

(56) References Cited

U.S. PATENT DOCUMENTS

| | | | | |
|---|---|---|---|---|
| 5,499,123 | A | 3/1996 | Mikoshiba | 359/59 |
| 5,913,111 | A | 6/1999 | Kataoka et al. | 438/163 |
| 2001/0030322 | A1 | 10/2001 | Yamazaki et al. | 257/59 |
| 2001/0030860 | A1 | 10/2001 | Kimura et al. | 362/31 |
| 2001/0035526 | A1 | 11/2001 | Yamazaki et al. | 257/57 |
| 2001/0041392 | A1 | 11/2001 | Suzawa et al. | 438/149 |
| 2001/0054999 | A1 | 12/2001 | Azami | 345/100 |
| 2002/0013022 | A1 | 1/2002 | Yamazaki et al. | 438/166 |
| 2002/0027247 | A1 | 3/2002 | Arao et al. | 257/347 |
| 2002/0028544 | A1 | 3/2002 | Fujimoto et al. | 438/166 |
| 2002/0195603 | A1 | 12/2002 | Arao et al. | 257/66 |
| 2003/0025158 | A1 | 2/2003 | Makita et al. | 257/347 |

FOREIGN PATENT DOCUMENTS

EP 0 723 286 7/1996

(Continued)

OTHER PUBLICATIONS

Liu, G. et al., "Polycrystalline Silicon Thin Film Transistors on Corning 7059 Glass Substrates Using Short Time, Low Temperature Processing," Appl. Phys. Lett., vol. 62, No. 20, pp. 2554-2556, May 17, (1993).

*Primary Examiner*—Jack Chen
(74) *Attorney, Agent, or Firm*—Cook, Alex, McFarron, Manzo, Cummings & Mehler, Ltd.

(57) ABSTRACT

To provide a manufacturing method for a field-effect transistor, such as a thin-film transistor, enabling reductions in the number patterning steps and the number of photomasks and improvements in the throughput and the yield. In the method, an oxide film is formed by processing the surface of a crystalline semiconductor with ozone water or hydrogen peroxide water. Using the oxide film thus formed as an etch stop, a gate electrode, a source electrode, and a drain electrode of the field-effect transistor are simultaneously formed from a same starting film in one patterning step by use of one photomask. After forming the gate electrode, the source electrode, and the drain electrode, heating is performed thereon at 800° C. or higher for a predetermined time. Thereby, the contact resistances between the source electrode and the crystalline semiconductor and between the drain electrode and the crystalline semiconductor are reduced, whereby improving the electrical conductivity.

14 Claims, 10 Drawing Sheets

FOREIGN PATENT DOCUMENTS

| | | |
|---|---|---|
| JP | 62-037968 | 2/1987 |
| JP | 04-320344 | 11/1992 |
| JP | 04-320345 | 11/1992 |
| JP | 04-320346 | 11/1992 |
| JP | 05-275456 | 10/1993 |
| JP | 08-211406 | 8/1996 |
| JP | 08-255907 | 10/1996 |
| JP | 08-330602 | 12/1996 |
| JP | 09-008312 | 1/1997 |
| JP | 10-270363 | 10/1998 |
| JP | 11-040560 | 2/1999 |
| JP | 2000-188256 | 7/2000 |

MANUFACTURING METHOD FOR FIELD-EFFECT TRANSISTOR

This application is a divisional of U.S. application Ser. No. 10/284,275, filed on Oct. 30, 2002 now U.S. Pat. No. 6,737,302.

BACKGROUND OF THE INVENTION

1. Field of the Invention

The present invention relates to a field-effect transistor such as a thin-film transistor and to a manufacturing method therefor. Further, the present invention relates to a manufacturing method for a display device using the field-effect transistors and to a display device manufactured using the manufacturing method for the display device. More specifically, the present invention relates to a field-effect transistor such as a thin-film transistor having a gate electrode, a source electrode, and a drain electrode of the thin-film transistor simultaneously formed by patterning a same starting film by use of photolithography and to a manufacturing method therefor.

2. Description of the Related Art

Hereinbelow, an example of a conventional manufacturing procedure for a thin-film transistor will be described. An amorphous silicon film is formed on the upper side of a glass substrate, the amorphous silicon film is crystallized, and a crystalline silicon film is thereby formed. Then, the crystalline silicon film is patterned into an island-like crystalline silicon film, and a gate insulation film is formed on the island-like crystalline silicon film. Subsequently, a conductive film formed on the gate insulation film is patterned, and a gate electrode is thereby formed. Then, using the gate electrode as a mask, an impurity is introduced to the island-like crystalline silicon film by using an ion doping method, and a source region and a drain region are thereby formed. Next, a first interlayer insulation film is formed on both the gate electrode and the island-like crystalline silicon film. Then, an opening (contact hole) is formed by performing patterning on the first interlayer insulation film so as to reach the source region and the drain region. Thereafter, a conductive film to be connected to the source region and the drain region is formed, and the conductive film is then patterned. Thereby, a source electrode and a drain electrode are formed. The thin-film transistor is manufactured according to the above-described procedure. The aforementioned procedure is well known (Refer to, for example, a patent document 1 below). When applying the thin-film transistor manufactured according to the well-known art to a pixel portion of a display device, a second interlayer insulation film is formed on both the source electrode and the drain electrode, and an opening is formed by performing patterning so as to reach one of the source electrode and the source electrode. In addition, a transparent conductive film is formed and patterned, and a pixel electrode is then formed.

(Patent Document 1)

Japanese Patent Application Laid-open No. Hei 8-330602 (FIGS. 1A to 1F; First Embodiment)

As described above, according to the conventional procedure; the source electrode and the drain electrode are formed after the gate electrode has been formed. That is, ordinarily, formation of the gate electrode and formation of the source electrode and the drain electrode are separately performed. Therefore, in the processes progressed to the stage where the formation of the source electrode and the drain electrode is completed, four patterning steps are performed, and four photomasks are used in the patterning steps. To complete the formation of the pixel electrode, two more patterning steps are performed. That is, in the above case, the number of the patterning steps is six, and the number of the photomasks used in the patterning steps is accordingly six.

At present, improvements in the throughput (quantity that can be processed in a unit time) and the yield (ratio of the number of finished products to the number of inputs to a manufacturing line) are strongly demanded in the field of the manufacture of field-effect transistors such as thin-film transistors and display devices using the field-effect transistors.

However, in the conventional procedure, since the number of steps in the conventional procedure is large, the time required for the manufacture of field-effect transistors and display devices cannot easily be reduced, and it is difficult to improve the yield. For example, because of shrinkage of a substrate or for other causes, a positional offset of a fine pattern formed in a subsequent patterning step can unexpectedly occur. The positional offset of the pattern results in the manufacture of defective products as well as in reduction in the yield. For example, in a step of forming an opening (contact hole) by performing patterning to form the source electrode and the drain electrode, the position of the opening is offset from the source region and the drain region where the opening is intended to be provided.

A case can be in which even when a positional offset of a pattern is caused at one patterning step, the offset is as slight as that falling within an allowable tolerance, and no adverse effects are thereby caused on the operation of a finished display device. However, when a number of patterning steps are repeatedly performed, the slight positional offset is enlarged, thereby increasing the probability of defective-product occurrence.

SUMMARY OF THE INVENTION

The present invention has been made in view of the above, and an object of the present invention is therefore to improve the yield by reducing the number of patterning steps and to reduce the manufacturing time by reducing the number of photomasks and by reducing the number of patterning steps in a way that incorporates a plurality of steps into one step.

According to the present invention, a surface of a crystalline semiconductor is oxidized using an oxidizing water solution, such as ozone water solution or hydrogen peroxide water solution, and an oxide film is thereby formed. With the oxide film being used as an etch stop, the gate electrode, the source electrode, and the drain electrode of a field-effect transistor are simultaneously formed from a same starting film. After the gate electrode, the source electrode, and the drain electrode have been formed, the electrodes are heated at a temperature of 800° C. or higher for a predetermined time in an ambient of an inert gas. In this case, either an argon gas or a nitrogen gas is used as the inert gas.

Further, according to the present invention, there is provided a manufacturing method for a field-effect transistor, comprising: forming a first insulation film on a crystalline semiconductor; forming a gate insulation film on a portion of the crystalline semiconductor by patterning the first insulation film; forming an oxide film by oxidizing a surface of the crystalline semiconductor by using an oxidizing water solution, such as ozone water solution or hydrogen peroxide water solution; forming a conductive film on the oxide film and the gate insulation film, the conductive film comprising a semiconductor film containing an n-type impurity; simultaneously forming a gate electrode, a source electrode, a drain electrode by patterning the conductive film; and introducing an n-type impurity to the crystalline semiconductor by using the gate electrode, the source electrode, and the drain electrode as masks. In the above stage, the oxide film exists between the source electrode and the crystalline semiconductor, and between the drain electrode and the crystalline semiconductor, the oxide film containing $SiO_x$ (0<X<2) and $SiO_2$. Thereafter, the crystalline semiconductor, the oxide film, the gate insulation film, the gate electrode, the source electrode, and the drain electrode are heated in an inert gas ambient, for example, a nitrogen ambient, at a temperature of from 800° C. to 1050° C. for a time period of from 30 minutes to 4 hours. By the heating, the n-type impurity contained in each of the source electrode and the drain electrode can be dispersed to the crystalline semiconductor, and in addition, the n-type impurity can be activated. Concurrently, the heating works to reduce the contact resistance between the source electrode and the crystalline semiconductor and the contact resistance between the drain electrode and the crystalline semiconductor. Instead of using the semiconductor film containing the n-type impurity, a semiconductor film containing a p-type impurity may be used; and instead of introducing the n-type impurity to the crystalline semiconductor, the p-type impurity may be introduced thereto.

According to the present invention, the oxide film, which has been formed such that the surface of the crystalline semiconductor is oxidized using one of the oxidizing water solution such as ozone water solution or hydrogen peroxide water solution, operates as an etch stop at the time of simultaneously forming the gate electrode, the source electrode, and the drain electrode from the conductive film. Therefore, the crystalline semiconductor is remained unetched. Ozone and hydrogen peroxide used to form the oxide film are water-soluble and each known as an oxidizer that oxidizes other materials. The conductive film needs to be formed using a material having a melting point higher than the temperature set in the above-described heating. In addition, the conductive film may be formed by overlaying metal having a melting point of 800° C. or higher on the crystalline silicon containing the n-type impurity. The metal may be selected from, for example, copper, palladium, chromium, cobalt, titanium, molybdenum, niobium, tantalum, and tungsten. Alternatively, the metal may be selected from metal silicide substrates such as cobalt silicide, titanium silicide, molybdenum silicide, niobium silicide, tantalum silicide, and tungsten silicide. Still alternatively, the conductive film may be formed in combination with a metal nitride substance, such as titanium nitride, tantalum nitride, or tungsten nitride.

In the present invention, the crystalline semiconductor is one of monocrystalline and polycrystalline semiconductors and is not limited to the form of a thin film. When using the crystalline semiconductor in the form of a thin film, a semiconductor film may be formed on the upper side of the substrate, and a crystalline semiconductor film formed by crystallizing the semiconductor film may be used. According to the present invention, since the heat treatment is performed at a temperature of from 800° C. to 1050° C., a usable substrate is limited to a substrate, such as a quartz substrate, a silicon substrate, or a stainless steel substrate, which is not deformable because of the heat treatment.

The present invention enables the use of such a method as described hereunder. Before forming a conductive film for the use of forming a gate electrode, a source electrode, and a drain electrode, the n-type impurity is introduced to a crystalline semiconductor by using the gate insulation film. Then, the gate electrode, the source electrode, and the drain electrode are formed. Thereafter, the n-type impurity is introduced again to the crystalline semiconductor, and a heat treatment is performed at a temperature of from 800° C. to 1050° C. In this case, a p-type impurity may be introduced to the semiconductor instead of the n-type impurity. In addition, as a material for forming the conductive film, a semiconductor including the n-type impurity or the p-type impurity need not always be used.

The above-described manufacturing method for a field-effect transistor may be applied to the manufacture of a display device using field-effect transistors manufactured according to the manufacturing method. Examples of the display device include an active matrix liquid crystal display device and an active matrix display device using light emitting devices (LEDs).

According to another aspect of the present invention, a field-effect transistor manufactured by using the manufacturing method for a field-effect transistor includes an island-like crystalline semiconductor film on the upper side of a substrate, a gate insulation film formed in a portion of the island-like crystalline semiconductor film, a source electrode and a drain electrode formed on the island-like crystalline semiconductor film, and a gate electrode formed on the gate insulation film, wherein the island-like crystalline semiconductor film includes a source region, a drain region, a low-density impurity region (LDD region), and a channel region; and $SiO_x$ (0<X<2) between the source electrode and source region and between the drain electrode and the drain region.

DETAILED DESCRIPTION OF THE PREFERRED EMBODIMENTS (First Embodiment Mode)

Hereinbelow, a first embodiment mode will be described using FIGS. 1A to 1E, 2A to 2E, 10A, and 10B.

Figure 1A:
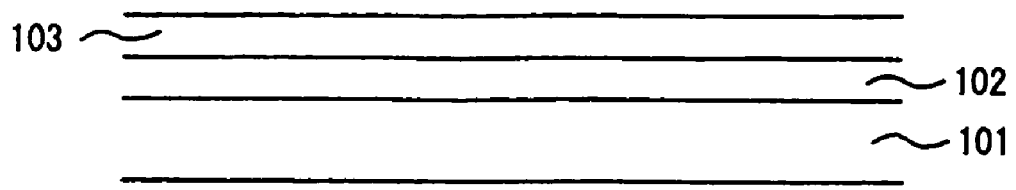
FIGS. 1A to 1E are cross-sectional views illustrative of a first embodiment mode according to the present invention.

As shown in FIG. 1A, a first insulation film 102 is formed on a substrate 101 in a range of from 100 nm to 1000 nm.

The first insulation film 102 may be any one of a silicon oxynitride film formed using a CVD method in which $SiH_4$ and $N_2O$ are used as source materials, a silicon nitride oxide film formed using the CVD (chemical vapor deposition) method in which $SiH_4$, $N_2O$, and $NH_3$ are used as source materials, a silicon oxide film, a nitrogen-containing silicon oxide film, and a silicon nitride film. Alternatively, the first insulation film 102 may be formed by combining and overlaying two or more of the aforementioned films. For the substrate 101, one of a quartz substrate, a silicon substrate, and a stainless steel substrate is used. When the quartz substrate is used, the first insulation film 102 need not be formed.

Subsequently, a semiconductor film 103 with a thickness of from 30 nm to 80 nm is formed on one of the substrate 101 and the first insulation film 102. The semiconductor film 103 may be any one of a silicon film, a germanium film, and a film containing silicon and germanium. The less the thickness of a semiconductor film in a range of from 30 nm to 80 nm, the greater the effects of reducing off-state current of a thin-film transistor.

Next, the semiconductor film 103 is crystallized using a well-known method. The semiconductor film 103 may be crystallized using any one of solid-phase epitaxy in which heat treatments are performed using an electric furnace, laser crystallization in which gas-laser or solid-state laser light of pulse oscillations or continuous oscillations is irradiated, and RTA (rapid thermal annealing). In solid-phase epitaxy, a method of doping the semiconductor film 103 with an element such as nickel for accelerating crystallization of a semiconductor film may be used. However, while the method is effective since it enables to lower the heating temperature and to reduce the heating time, the nickel contained in the semiconductor film 103 needs to be gettered and removed as much as possible after crystallization.

At present, as a method of crystallizing semiconductor films, laser crystallization is widely researched. Hereinbelow, lasers to be used for the crystallization will be described in detail.

Gas lasers that may be used include, for example, an excimer laser, an Ar laser, and a Kr laser. Solid-state lasers that may be used include, for example, a YAG laser, a glass laser, a ruby laser, an alexandrite laser, and a Ti:sapphire laser.

Solid-state lasers to be used include, for example, lasers using YAG, $YVO_4$, YLF, and $YAlO_3$ crystals that are doped with one of Cr, Nd, Er, Ho, Ce, Co, Ti, or Tm. The fundamental of the laser to be used depends on the material to be doped, and a laser beam having a fundamental of about 1 μm can be obtained. The harmonics corresponding to the fundamental can be obtained by use of a nonlinear optical element.

To obtain large-diameter crystal in crystallization of the semiconductor film, it is preferable that a solid-state laser continually oscillatable be used to employ a second harmonic, a third harmonic, and a fourth harmonic of a fundamental. Typically, a second harmonic (532 nm) and a third harmonic (355 nm) of Nd:$YVO_4$ laser light (fundamental: 1064 nm) is employed.

Laser light emitted from an $YVO_4$ laser for generating continuous oscillations with a 10 W output is converted by a nonlinear optical device into harmonics. Another usable method is also available in which an $YVO_4$ crystal and a nonlinear optical device is included in a resonator to emit harmonics. Preferably, the optical system is used to perform rectification into rectangular or ellipsoidal laser light on an irradiation surface, and the laser light is thereby radiated to a processing target. In this case, an energy density of about 0.1 to 100 $MW/cm^2$ (preferably, 0.1 to 10 $MW/cm^2$) is necessary. The semiconductor film is relatively moved with respect to the laser light at a speed of about 0.5 to 2000 cm/s, and is thereby irradiated.

Figure 1B:
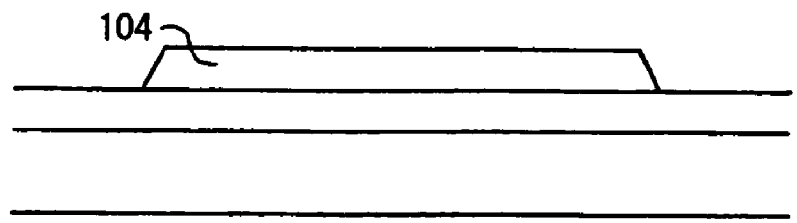

As shown in FIG. 1B, the semiconductor film 103 thus crystallized is patterned using photolithography, and an island-like crystalline semiconductor film 104 is thereby formed. In the patterning, a first photomask is used.

Figure 1C:
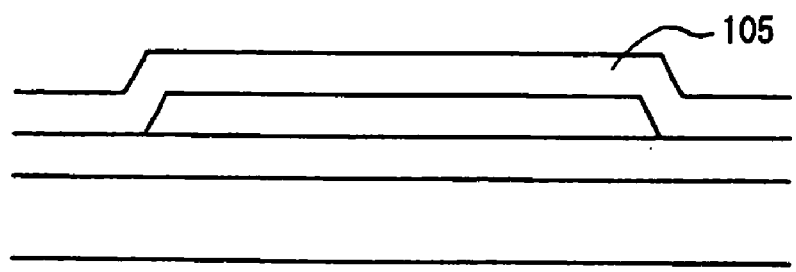
Figure 1D:
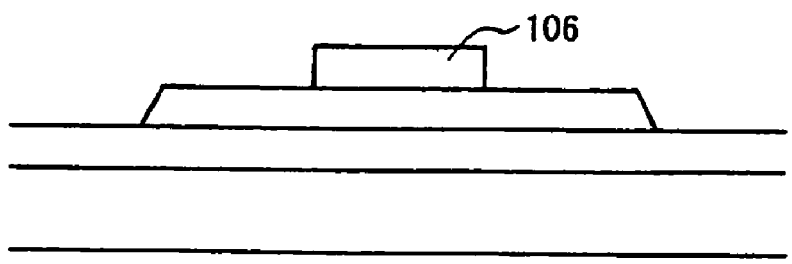

Subsequently, as shown in FIG. 1C, a second insulation film 105 is formed to a thickness of from 20 nm to 130 nm on one of the substrate 101, the first insulation film 102, and the crystalline semiconductor film 104. The second insulation film 105 may be any one of a silicon oxynitride film, a silicon oxide film, a nitrogen-containing silicon oxide film, and a silicon nitride film that are deposited using a CVD method in which $SiH_4$ and $N_2O$ are used as source materials. Alternatively, the second insulation film 105 may be formed by combining and overlapping two or more of the aforementioned films. Then, as shown in FIG. 1D, the second insulation film 105 is patterned using photolithography, a portion of the surface of the crystalline semiconductor film 104 is exposed, and an island-like second insulation film 106 to be used as a gate insulation film is thereby formed. In the patterning, a second photomask is used. Before patterning the second insulation film 105, a p-type impurity such as boron may be introduced to the entirety of the crystalline semiconductor film 104. This is a well-known technique generally called "channel doping", and the channel doping is performed at a later stage to introduce the p-type impurity to a portion that is to be used as a channel region.

Figure 1E:
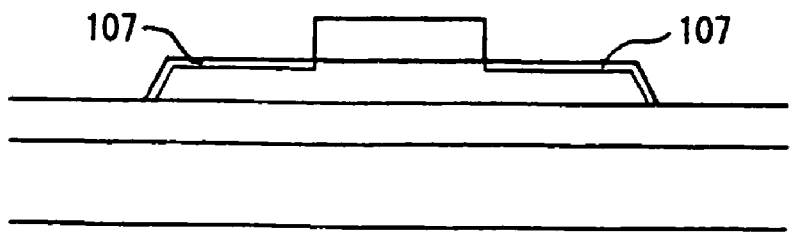

Next, native oxides are removed with dilute hydrofluoric acid water solution from the surface of the island-like crystalline semiconductor film 104 whose surface has been exposed when forming the second insulation film 106. Then, as shown in FIG. 1E, the aforementioned surface is oxidized, and an oxide film 107 is formed. The oxide film 107 is formed by applying an oxidizing water solution by use of a spin coating technique on the surface desired to be oxidized. More specifically, the substrate 101 on which at least the crystalline semiconductor film 104 and the second insulation film 106 are formed is rotated. At the same time, ozone ($O_3$) water solution (which hereinbelow will be referred to as "ozone water" in the present specification) is applied to continually flow to the surface of the crystalline semiconductor film 104 at a room temperature for a time period of from 30 seconds to 120 seconds. Ozone is a gas and water-soluble at a normal temperature and a normal pressure, and exhibits great oxidation effects. The water used as a solvent for the ozone water is deionized water treated by removing fine foreign matters and impurities, and the ozone water having a density of from 8 mg/l to 15 mg/l is used. Thereafter, the surface is washed with the deionized water, and the ozone water is thereby removed from the surface. Then, while nitrogen is sprayed, the substrate 101 is rotated, and the surface is dried.

The oxide film 107 thus formed is very thin. Therefore, although the precise film thickness cannot easily be measured, the film 107 is formed within a range of from 0.7 nm to 2.0 nm. Even when the time (processing time) in which the ozone water flows is varied, no significant changes occur in the thickness of the oxide film that is to be formed; and in a time of from 30 seconds to 120 seconds, the thickness of the oxide film falls in a range of from 0.7 nm to 2.0 nm.

To analyze the composition of the oxide film by use of the ozone water, a spectrum of Si2p was measured for an oxide film formed applying ozone water having a density of 14 mg/l to flow to silicon-wafer surfaces ((100) surfaces) at a room temperature for a time period of 60 seconds. The analysis was performed using an analyzer called an "ESCA" (electron spectroscopy for chemical analysis) or an "XPS" (x-ray photoelectron spectroscopy) that is capable of identifying a chemical bond condition of elements of a specimen surface. The result revealed two peaks of binding energy in a range of from 96 to 106 eV. The one is a $Si^{4+}$ peak, and the other is a Si peak. Since the Si peak has an oxide film which is small in film thickness, it is detected from the silicon wafer. Since the $Si^{4+}$ peak includes small peaks of $Si^{1+}$, $Si^{2+}$, and $Si^{3+}$, waveform separation was performed according to Gaussian functions and Lorentz functions. Then, according to the peak forms, oxidized condition of silicon was analyzed. As a result, with respect to 100% representing the sum of $Si^{1+}$, $Si^{2+}$, $Si^{3+}$, and $Si^{4+}$, the ratios were 8.8% for $Si^{1+}$, 8.8% for $Si^{2+}$, 6.4% for $Si^{3+}$, and 76.0% for $Si^{4+}$. $Si^{1+}$, $Si^{2+}$, and $Si^{3+}$ are referred to as "suboxides". The suboxide represents a state where the silicon did not sufficiently react with oxygen and partly remained bonded with silicon. Suppose the ratio of $Si^{4+}$ is 100%, and the ratios of the suboxides are each 0%. In this case, it can be determined that the oxide film has been sufficiently oxidized and has been formed of stable $SiO_2$. The oxide film formed on the surface of the silicon wafer by use of the ozone water can be expressed as a silicon oxide film formed of $SiO_x$ (0<X<2) and $SiO_2$. The thickness of the oxide film was measured by an analyzer called a "spectro-ellipsometry", and found to be 0.81 nm.

As a comparison example, the spectrum of Si2p was measured using the ESCA for an oxide film deposited on a silicon wafer by use of a CVD method in which $Si(OC_2H_5)$ called "TEOS" and $O_2$ are used as source materials. Then, analysis was performed as had been performed for the oxide film formed using the ozone water. As a result, with respect to 100% representing the sum of $Si^{1+}$, $Si^{2+}$, $Si^{3+}$, and $Si^{4+}$, the ratios were 1.8% for $Si^{1+}$, 0.9% for $Si^{2+}$, 4.6% for $Si^{3+}$, and 92.7% for $Si^{4+}$. Thus, the oxide film deposited using the CVD method was found to exhibit a higher ratio of $SiO_2$ than the oxide film formed using the ozone water.

Figure 2A:
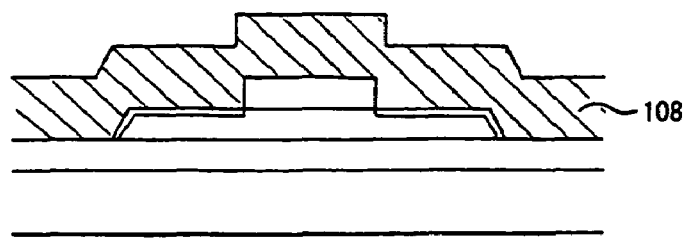
FIGS. 2A to 2E are cross-sectional views illustrative of the first embodiment mode according to the present invention.

Subsequently, as shown in FIG. 2A, a conductive film 108 is formed overall on the substrate 101 (or on the first insulation film 102), the oxide film 107, and the island-like second insulation film 106 to a thickness of from 200 nm to 500 nm. The conductive film 108 is formed by depositing a crystalline silicon film containing n-type impurity by use of a CVD method in which the deposition temperature is set to 500° C. or higher. The crystalline silicon film thus formed is doped with an n-type impurity of $1\times10^9$ $cm^{-3}$ to $5\times10^{21}$ $cm^{-3}$. For example, phosphorous is used as the n-type impurity. The conductive film 108 may be multilayered. Specifically, a film made of a heat-resistant material, such as titanium, molybdenum, tungsten, molybdenum silicide, or tungsten silicide, may further be formed on the crystalline silicon film containing the n-type impurity to impart resistance to the conductive film 108. Further forming a film formed of titanium nitride, molybdenum nitride, or tungsten nitride between the n-type impurity-containing crystalline silicon film and the titanium, molybdenum, or tungsten film enables counter-dispersion to be prevented from occurring between the crystalline silicon film containing the n-type impurity and the film of titanium, molybdenum, or tungsten.

Figure 2B:
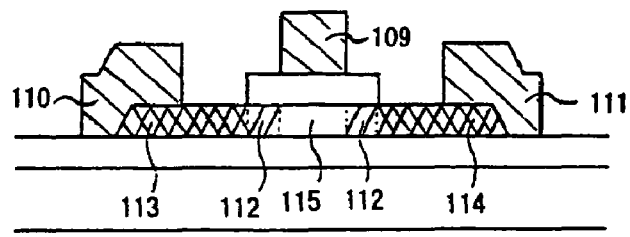

Next, as shown in FIG. 2B, a gate electrode 109, a source electrode 110, and a drain electrode 111 are simultaneously formed by patterning the conductive film 108 by use of photolithography. In this case, the oxide film 107 operates as an etch stop, thereby causing the crystalline semiconductor film 104 to remain unetched. The above-described patterning is performed using a third photomask.

Subsequently, an n-type impurity such as phosphorous is introduced to the crystalline semiconductor film 104. The impurity introduction may be performed by an ion implantation method, which involves mass separation, and an ion doping method, which does not involve mass separation. However, the ion doping method also introduces hydrogen in addition to the n-type impurity. The introduction is performed such that, in the crystalline semiconductor film 104, the n-type impurity is introduced to first regions covered by only the oxide film 107 and to second regions covered by only the second insulation film 106, whereas the n-type impurity is not introduced to a lower region of the gate electrode 109. As a result, the density of the n-type impurity in the second regions is lower than that in the first regions; hence, the second regions refer low-density impurity regions 112 (LDD regions). The first regions are included to portions of a source electrode 113 and a drain region 114. A region that is located below the gate electrode 109 and that is sandwiched by the low-density impurity regions 112 (LDD regions) is used as a channel region 115. The low-density impurity regions 112 (LDD regions), the source electrode 113, and the drain region 114 can be formed with one-time introduction of the n-type impurity. However, a case can be considered to occur in which the density of the n-type impurity to be introduced to the first regions becomes too low to form the source region 113 and the drain region 114. In this case, the n-type impurity needs to separately be introduced two times. In the first introduction, the low-density impurity regions 112 (LDD regions) are formed at a high speed and with a low dose so that the n-type impurity is introduced to reach a lower portion of the second insulation film 106. In the second introduction, the source electrode 113 and the drain region 114 are formed with a high dose at a speed lower than that in the first introduction. The first and second introductions may be performed in the reverse order.

After the n-type impurity has been introduced as described above, the oxide film 107 still exists between the portion where the source electrode 110 and the drain electrode 111 are formed and the crystalline semiconductor film 104. As described above, the thickness of the oxide film 107 is as small as 0.7 nm to 2.0 nm. However, since high contact resistance occurs between individual portions where the source electrode 110 and drain electrode 111 are formed and the crystalline semiconductor film 104 is not preferable, the oxide film 107 should not remain. The oxide film 107 becomes unnecessary upon completion of formation of the gate electrode 109, the source electrode 110, and the drain electrode 111. Therefore, even in a case where oxygen is desorbed from the oxide film 107, and the oxide film 107 is thereby changed to a film in which a number of lattice defects have been developed and which no longer has the feature of a film, the case is preferable, and no care needs to be taken.

In view of the situation described above, the contact resistance between the source electrode 110 and drain electrode 111 and the crystalline semiconductor film 104 is reduced to improve the electric conductivity. To achieve the improvement, at least the crystalline semiconductor film 104, the oxide film 107, the source electrode 110, and the drain electrode 111 are heated at a temperature of from 800° C. to 1050° C. in a nitrogen ambient. The heat-treatment ambient is not limited to the nitrogen ambient, and any other inert gas ambients may be used. The heating time is set to a range of from 30 minutes to 4 hours. When the heating temperature is set to 800° C., the heating time is preferably in a range of from 2 to 4 hours. When the heating temperature is set to 950° C., the heating time may be about 30 minutes. The heating temperature should not unnecessarily be increased to improve the throughput. The upper limit of the heating temperature is determined depending on the type of the substrate 101, the material for forming the conductive film 108, and the heating means. In a configuration including a stainless steel used for the substrate 101, care needs to be given to a case where antibrittleness and anticorrosion properties of the stainless steel can deteriorate depending on the heating temperature and the heating time.

When heating has been performed at the aforementioned temperature range, i.e., a temperature of from 800 to 1050° C., the oxide film 107 changes in characteristics so that it no longer functions as an etch stop. In addition, damage caused in the crystalline semiconductor film 104 during the introduction of the n-type impurity is rectified. Further, crystallinity can be increased for amorphous portions and for regions insufficiently crystallized during the crystallization of the semiconductor film 103, thereby, phosphorous contained in the source electrode 110 and the drain electrode 111 is dispersed into the crystalline semiconductor film 104. The dispersion works to form phosphorous-introduced impurity regions also in regions below the source electrode 110 and the drain electrode 111 of the crystalline semiconductor film 104. Consequently, the phosphorous-introduced impurity regions and the first regions are combined, and the source electrode 113 and the drain region 114 are thereby formed.

The present inventors consider reasons for the change in the characteristics of the oxide film 107, as described hereunder. Since heating performed at a temperature of from 800° C. to 1050° C. disables the oxide film 107 to function as an etch stop, oxygen is desorbed from the oxide film 107, $SiO_x$ ($0<X\leq2$) composing the oxide film 107 is reduced in the value of "X", and even the case of "X=0" is therefore incorporated thereinto. For this reason, the n-type impurity is prone to dispersing, thereby improving the electrical conductivity between the source electrode 110 and drain electrode 111 and the crystalline semiconductor film 104.

Figure 10A:
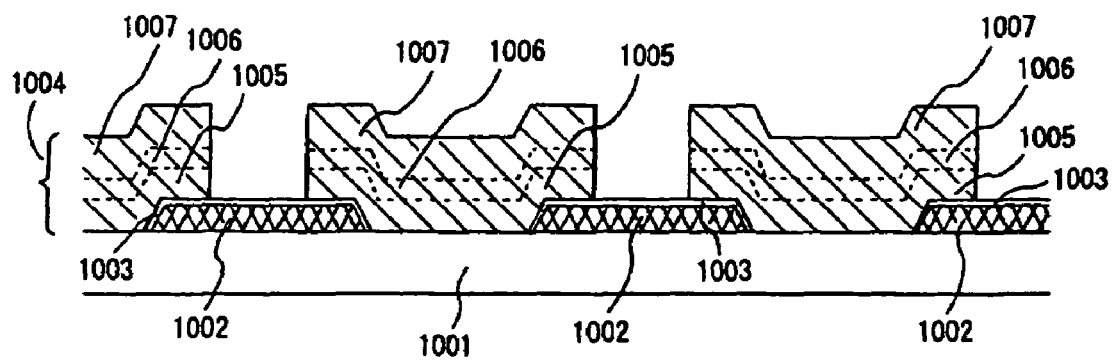
FIG. 10A is a cross-sectional view of a transistor and FIG. 10B is a chart showing effects of heat treatments according to the present invention.

Experiments were performed to clarify that the contact resistance varies according to the heat treatment. First, an example was prepared for measuring the contact resistance, of which a cross section is shown in FIG. 10A. Referring to FIG. 10A, numeral 1001 denotes a quartz substrate, numeral 1002 denotes an island-like crystalline silicon film containing phosphorous, numeral 1003 denotes an oxide film, and numeral 1004 denotes an electrode. The oxide film 1003 was formed by oxidizing the surface of the crystalline silicon film 1002 in a process using ozone water. The electrode 1004 is formed by sequentially laminating a phosphorous-containing crystalline silicon film 1005, a tungsten nitride film 1006, and a tungsten film 1007. The actual resistance-measurement example was formed to include continually formed 1,000 portions in each of which the crystalline silicon film 1002 is covered with the electrode 1004 (portion where the crystalline silicon film 1002 and the electrode 1004 are formed adjacent to each other via the oxide film 1003). FIG. 10A shows only a portion of the cross section of the example.

Figure 10B:
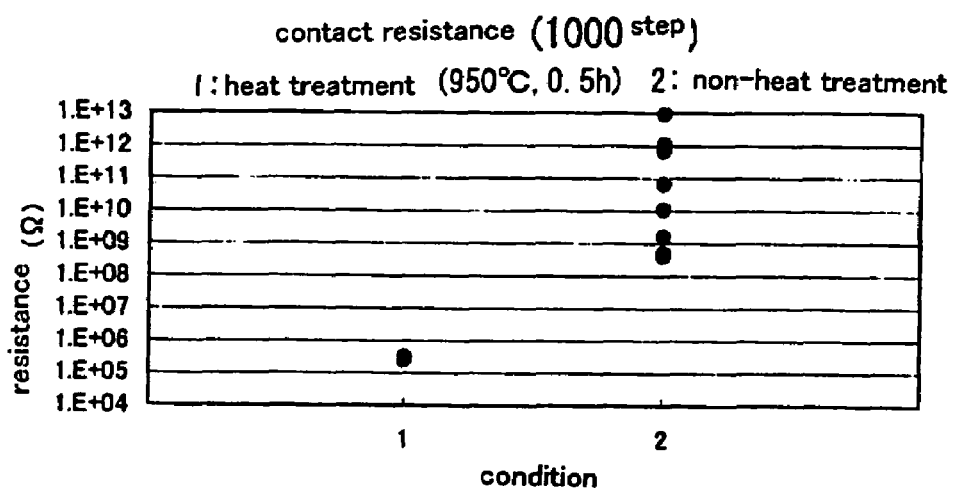

FIG. 10B shows plotted results of contact-resistance measurements performed for the example prepared as described above for eight points under two different conditions respectively, namely, condition 1 and condition 2. The condition 1 represents a case where heat treatment was performed at a temperature of 950° C. for a time period of 30 minutes, and the condition 2 represents a case where the heat treatment was not performed. The contact resistances are in a range of from $1\times10^5$ Ω to $1\times10^6$ Ω under the condition 1, the contact resistances are in a range of from $1\times10^8$ Ω to $1\times10^{13}$ Ω under the condition 2. According to the results, the contact resistances and variations in the eight-point contact resistances under the condition 1, in which the heat treatment was performed, are less than those under the condition 2, in which the heat treatment was not performed. Thus, the results show effects of the heat treatment. As described above, since the actual resistance-measurement example was formed to include continually formed 1,000 portions in each of which the crystalline silicon film 1002 is covered with the electrode 1004, the results can be considered to represent the resistances of series-connected 1,000 stages. Therefore, it should be noticed that the contact resistance of one portion where the crystalline silicon film 1002 is covered with the electrode 1004 corresponds to 1/1000 of the, value shown in FIG. 10B. Accordingly, the contact resistance of one portion where the crystalline silicon film 1002 is covered with the electrode 1004 is in a range of from $1\times10^2$ Ω to $1\times10^3$ Ω under the condition 1, and is in a range of from $1\times10^5$ Ω to $1\times10^{10}$ Ω under the condition 2.

Figure 2C:
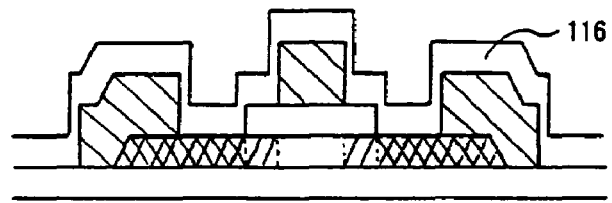

Next, as shown in FIG. 2C, a third insulation film 116 is formed to a thickness of from 100 nm to 1000 nm. The third insulation film 116 may be any one of a silicon oxynitride film, a silicon nitride oxide film, silicon oxide film, a nitrogen-contained silicon oxide film, and silicon nitride, film. The aforementioned silicon oxynitride film is deposited using a CVD method in which $SiH_4$ and $N_2O$ are used as source materials; and the aforementioned silicon nitride oxide film is deposited using a CVD method in which $SiH_4$, $N_2O$, and $NH_3$ are used as source materials. Alternatively, the third insulation film 116 may be formed by combining and overlaying two or more of the aforementioned films. Thereafter, the crystalline semiconductor film 104, the gate electrode 109, the source electrode 110, and the drain electrode 111 are heated at a temperature of from 800° C. to 1050° C. in a nitrogen ambient for a time period of from 30 minutes to 2 hours to cause the n-type impurity contained in the films to be active. In this case, the nitrogen ambient may contain hydrogen and after the heat treatment in the nitrogen ambient, the films may be heated in an ambient containing nitrogen and hydrogen for about one hour. When the n-type impurity has sufficiently been activated by the heat treatment performed at a temperature of from 800° C. to 1050° C. to change the characteristics of the oxide film 107, the heat treatment in the nitrogen ambient for activating the n-type impurity may be omitted. Further, instead of performing the heat treatment in a nitrogen ambient at a temperature of from 800° C. to 1050° C. for a time period of from 30 minutes to 4 hours before the third insulation film 116 is formed, a heat treatment may be performed in a nitrogen ambient at a temperature of from 800° C. to 1050° C. for a time period of from 30 minutes to 4 hours after the third insulation film 116 has been formed. In this case, the third insulation film 116 operates as a passivation film during the heat treatment.

Figure 2D:
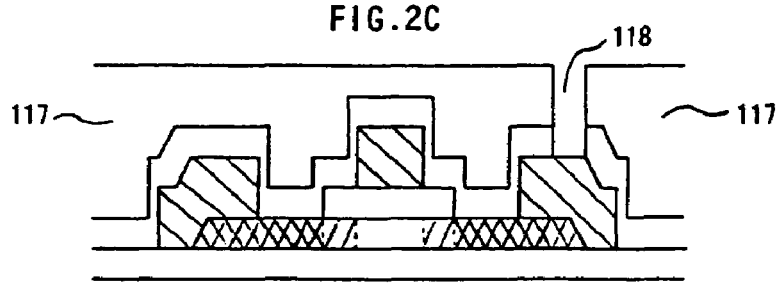

Subsequently, as shown in FIG. 2D, a fourth insulation film 117 is formed on the third insulation film 116 to obtain a planar surface. The fourth insulation film 117 may be formed using an organic resin, such as a polyimide resin, an acrylic resin, or benzocyclobutene (BCB). Alternatively, the insulation film 117 may be formed using a silicon oxide film formed by using a coating technique called "SOG technique" (spin-on-glass technique). Still alternatively, the fourth insulation film 117 may be formed by polishing a surface of an inorganic insulation film such as a silicon oxide film by use of a well-known chemical-mechanical polishing (CMP) technique. Then, the third insulation film 116 and the fourth insulation film 117 are patterned using photolithography, and an opening 118 is formed to reach the drain electrode 111 (or the source electrode 110). The patterning uses a fourth photomask.

Figure 2E:
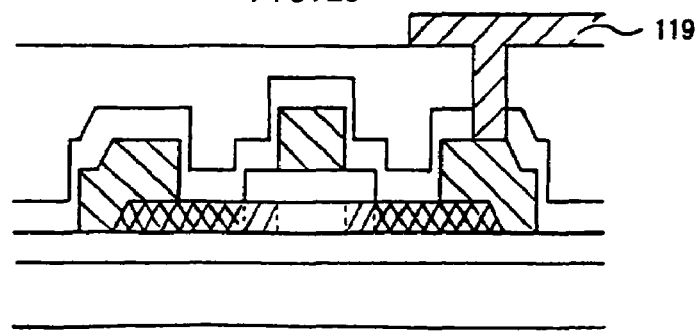

Next, as shown in FIG. 2E, after a transparent conductive film is formed overall on the fourth insulation film 117 to a thickness of from 50 nm to 150 nm, a pixel electrode 119 is formed by performing patterning according to well-known photolithography. The transparent conductive film may be formed of any one of tin oxide, a compound called "indium tin oxide (ITO)" made of indium oxide and tin oxide, and a compound of indium oxide and zinc oxide. The aforementioned patterning uses a fifth photomask.

As described above, in the present embodiment mode, three patterning steps are performed in the processing to complete formation of the source electrode 110 and the drain electrode 111, and three photomasks are used during the processing. However, in the processing described in Section "Description of the Related Art" of this document, four patterning steps are performed in the processing to complete the formation of the source electrode and the drain electrode, and four photomasks are used during the processing. Thus, compared to the related art, in the present embodiment mode, the patterning steps can be reduced by one step, and the photomasks can be reduced by one piece. In addition, the present embodiment mode has advantages described hereunder since the gate electrode 109, source electrode 110, and the drain electrode 111 are simultaneously formed using only one photomask. The present embodiment mode enables the interface pitch between the gate electrode 109 and the source electrode 110 and the interface pitch between the gate electrode 109 and the drain electrode 111 to easily be modified. The minimum value of each of the interface pitches is determined by design rules, and the interface pitch may be reduced as much as the design rules permit, without considering margins. Thus, the transistor size can be reduced to enhance the integration density of the transistor. In addition, the present invention enables the area of a portion where the source electrode 113 is covered with the source electrode 110 and the area of a portion where the drain region 114 is covered with the drain electrode 111 to easily be modified so that optimal electrical characteristics can be obtained.

(Second Embodiment Mode)

The first embodiment mode uses the crystalline silicon film containing the n-type impurity for the conductive film 108 that is used to form the gate electrode 109, the source electrode 110, and the drain electrode 111. However, in the present embodiment mode, a crystalline silicon film containing n-type impurity needs not be used for a conductive film. The present embodiment mode is dissimilar to the first embodiment mode in that the second insulation film 106 is used as a mask to introduce either n-type impurity or p-type impurity to the crystalline semiconductor film 104 before the conductive film 108 is formed. Processes corresponding those shown to FIGS. 1A to 1D are common to those in the first embodiment mode of the present invention. Thus, only processes subsequent to the process corresponding to that shown FIG. 1D will be described hereunder with reference to FIGS. 3A to 3E.

After completion of the forming processes to the stage shown in FIG. 1D, the n-type impurity such as phosphorous is introduced to the crystalline semiconductor film 104 by use of the island-like second insulation film 106 as a mask. The n-type impurity is not introduced to a portion covered with the second insulation film 106, and the impurity is introduced to a portion not covered by the second insulation film 106. Then, a source region 313 and a drain region 314 are formed. The introduction of the n-type impurity may be performed by any one of an ion implantation method that involves mass separation and an ion doping method that does not involve mass separation. In the present embodiment mode, instead of the n-type impurity, a p-type impurity such as boron may be used. Thereafter, as shown in FIG. 3A, an oxide film 307 is formed in the same methods as those in the first embodiment mode of the present invention.

Figure 3A:
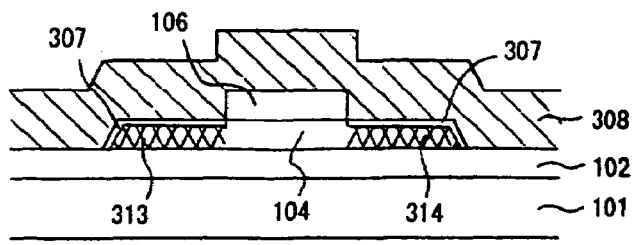
FIGS. 3A to 3E are cross-sectional views illustrative of a second embodiment mode according to the present invention.

Subsequently, as shown in FIG. 3A, a conductive film 308 is formed overall on the substrate 101 or the first insulation film 102, the oxide film 307, and the island-like second insulation film 106 to a thickness of from 200 nm to 500 nm. The conductive film 308 may be formed of any one of, for example, copper, palladium, chromium, cobalt, titanium, molybdenum, niobium, tantalum, and tungsten. Still alternatively, the conductive film 308 may be formed in combination with, for example, titanium nitride, tantalum nitride, tungsten nitride, cobalt silicide, titanium silicide, molybdenum silicide, niobium silicide, tantalum silicide, or tungsten silicide. In addition, similarly to the first embodiment mode, crystalline silicon containing the n-type impurity may be used as at least a portion of materials composing the conductive film 308.

Figure 3B:
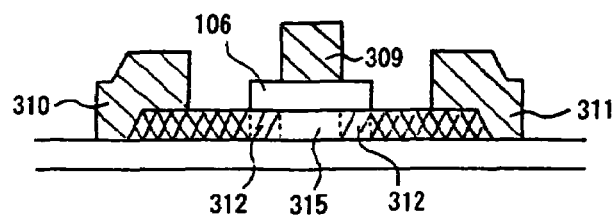

Next, as shown in FIG. 3B, a gate electrode 309, a source electrode 310, and a drain electrode 311 are simultaneously formed by patterning the conductive film 308 by use of photolithography. In this case, the oxide film 307 operates as an etch stop, thereby causing the crystalline semiconductor film 104 to remain unetched.

Subsequently, an n-type impurity such as phosphorous is introduced again to a region covered only by the second insulation film 106 in the crystalline semiconductor film 104 to thereby form low-density impurity regions 312 (LDD regions). The density of the n-type impurity in the low-density impurity regions 312 (LDD regions) is lower than that in the source region 313 and the drain region 314. A region that is below the gate electrode 309 and sandwiched by the low-density impurity regions 312 (LDD regions) is not doped with the n-type impurity, and is used as a channel region 315. Instead of the n-type impurity, p-type impurity may be used. Then, at least the crystalline semiconductor film 104, the oxide film 307, the source electrode 310, and the drain electrode 311 are heated at a temperature of from 800° C. to 1050° C. for a time period of from 30 minutes to 4 hours in a nitrogen ambient. The heating ambient is not limited to the nitrogen ambient, but any other inert gas ambients may be used. The above-described heating works to reduce the contact resistance between the source electrode 310 and the source region 313 as well as the contact resistance between the drain electrode 311 and the drain region 314.

Figure 3C:
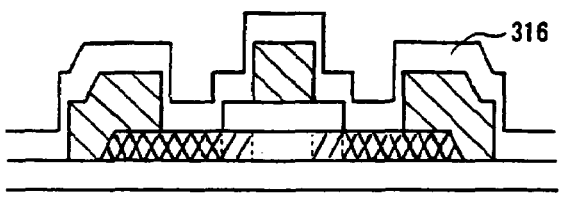

Next, as shown in FIG. 3C, a third insulation film 316 is formed to a thickness of from 100 nm to 1000 nm. The third insulation film 316 may be any one of a silicon oxynitride film, a silicon nitride oxide film, silicon oxide film, and silicon nitride film. The aforementioned silicon oxynitride film is deposited using a CVD method in which $SiH_4$ and $N_2O$ are used as source materials; and the aforementioned silicon nitride oxide film is deposited using a CVD method in which $SiH_4$, $N_2O$, and $NH_3$ are used as source materials. Alternatively, the third insulation film 316 may be formed by combining and overlaying two or more of the aforementioned films. Further, as described above, the heat treatment in the nitrogen ambient at a temperature of from 800° C. to 1050° C. for a time period of from 30 minutes to 4 hours before the third insulation film 316 is performed. Instead of the heat treatment, however, a heat treatment may instead be performed in a nitrogen ambient at a temperature of from 800° C. to 1050° C. for a time period of from 30 minutes to 4 hours after the third insulation film 316 has been formed.

Figure 3D:
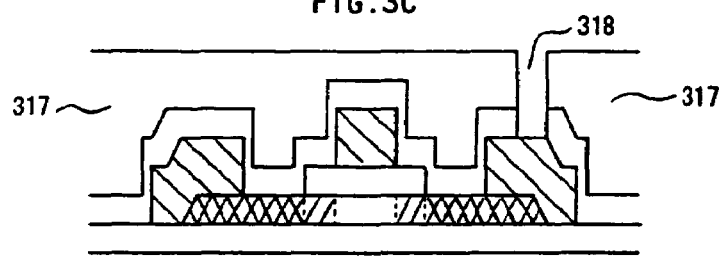

Subsequently, as shown in FIG. 3D, a fourth insulation film 317 having a thickness of from 1000 nm to 4000 nm is formed on the third insulation film 316 to obtain a planar surface. The fourth insulation film 317 may be formed using an organic resin, such as a polyimide resin, an acrylic resin, or benzocyclobutene (BCB). Alternatively, the film 317 may be formed using a silicon oxide film formed using a coating technique called a "SOG technique". Then, the third insulation film 316 and the fourth insulation film 317 are patterned using photolithography, and an opening 318 is formed to reach the drain electrode 311 (or the source electrode 310).

Figure 3E:
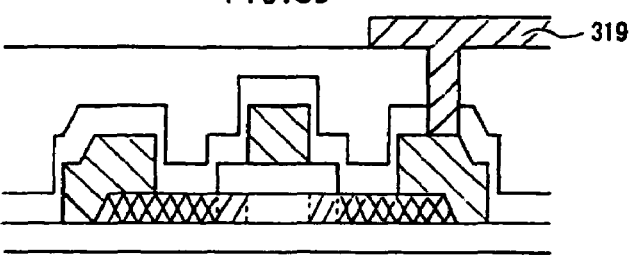

Next, as shown in FIG. 3E, after a transparent conductive film is formed overall on the fourth insulation film 317, a pixel electrode 319 is formed by performing patterning according to well-known photolithography. The transparent conductive film may be formed of any one of tin oxide, a compound called "indium tin oxide (ITO)" made of indium oxide and tin oxide, and a compound of indium oxide and zinc oxide.

As described above, similarly to the first embodiment mode of the present invention, in the present embodiment mode, three patterning steps are performed in the processing to complete formation of the source electrode 310 and the drain electrode 311, and three photomasks are used during the processing. Thus, according to the present embodiment mode, compared to the conventional art, the patterning steps can be reduced by one step and the photomasks can be reduced by one piece. In addition, the present embodiment mode has advantages described hereunder since the gate electrode 309, source electrode 310, and the drain electrode 311 are simultaneously formed using only one photomask. The present embodiment mode enables the interface pitch between the gate electrode 309 and the source electrode 310 and the interface pitch between the gate electrode 309 and the drain electrode 311 to easily be modified. Thus, the transistor size can be reduced to enhance the integration density of the transistor. In addition, the present invention enables the area where the source electrode 313 is covered with the source electrode 310 and the area where the drain region 314 is covered with the drain electrode 311 to easily be modified, so that optimal electrical characteristics can be obtained.

(Third Embodiment Mode)

As described above, in the first embodiment mode of the present invention, the ozone water is used to form the oxide film 107. However, in a third embodiment mode, water solution of hydrogen peroxide ($H_2O_2$) (which hereinbelow will be referred to as "hydrogen peroxide water" in the present specification) is used for the film formation. Hereinbelow, the present embodiment mode will be described only for matters dissimilar to the first embodiment mode.

The substrate 101 on which at least the crystalline semiconductor film 104 and the second insulation film 106 are formed is rotated. During the rotation, hydrogen peroxide water of a room temperature or a temperature of 80° C. is applied so as to continually flow to the surface of the crystalline semiconductor film 104 for a time period of from 30 seconds to 600 seconds. For the hydrogen peroxide water, hydrogen peroxide water solution having a density of from 30 wt % to 35 wt % (31 wt % for example) is used. Hydrogen peroxide is liquid and water-soluble at a normal temperature and a normal pressure, and exhibits oxidation effects. As in the case of the ozone water, the deionized water is used as a solvent.

As in the first embodiment mode, also the oxide film formed in the present embodiment mode is very thin. Therefore, although the precise film thickness cannot easily be measured, the film is formed within a range of from 0.7 nm to 1.5 nm when processed in the room temperature or within a range of from 1.0 nm to 2.0 nm when processed at a temperature of 80° C. Even when the time (processing time) in which the hydrogen peroxide water flows changes, no significant variations occur in the thickness of the oxide film that is to be formed.

Subsequent processes are similar to those in the first embodiment mode of present invention. However, as described in the second embodiment mode, the conductive film 108 is formed of any one of, for example, copper, palladium, chromium, cobalt, titanium, molybdenum, niobium, tantalum, and tungsten. Further, the conductive film 108 is combined with, for example, titanium nitride, tantalum nitride, tungsten nitride, cobalt silicide, titanium silicide, molybdenum silicide, niobium silicide, tantalum silicide, or tungsten silicide. In this case, the crystalline silicon film containing the n-type impurity need not be used, and processes may be performed according to the processes in the second embodiment mode.

(Fourth Embodiment Mode)

As described above, in the first embodiment mode of the present invention, the first insulation film 102 is formed on the substrate 101. However, in a fourth embodiment mode, a light-shielding film is provided between the substrate 101 and the first insulation film 102. Hereinbelow, referring to FIGS. 4A to 4C, the present embodiment mode will be described only for matters dissimilar to the first embodiment mode.

Figure 4A:
FIGS. 4A to 4C are cross-sectional views illustrative of a fourth embodiment mode according to the present invention.

As shown in FIG. 4A, a light shield film 400 is formed to a thickness of from 100 nm to 300 nm on the substrate 101. The light-shielding film 400 is formed to prevent the crystalline semiconductor film 104, which will be formed later, from being irradiated. The light-shielding film 400 is patterned and formed in an island shape so as to overlap at least the channel region of the crystalline semiconductor film 104. The light-shielding film 400 may be formed using, for example, one of chromium, tungsten, molybdenum, niobium, tantalum, titanium, titanium silicide, molybdenum silicide, niobium silicide, tantalum silicide, and tungsten silicide films. Alternatively, the light-shielding film 400 may be formed in a so-called polyside structure, which is formed by laminating a metal silicide film such as a tungsten silicide film on a crystalline silicon film containing n-type impurity. When the light-shielding film 400 is formed of a conductive film, it can be used to function as a gate electrode.

Figure 4B:
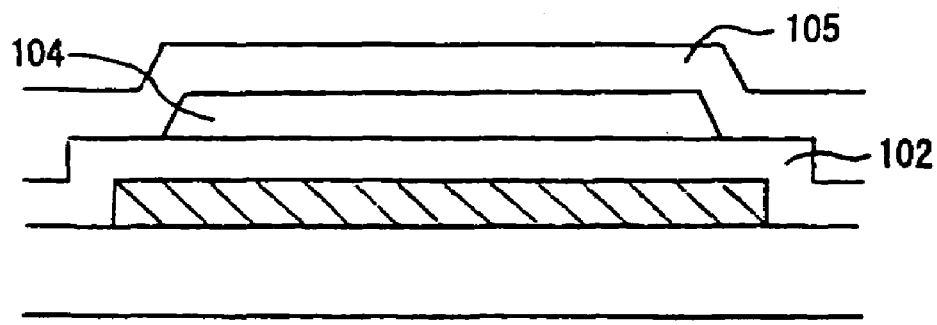

Next, as in the first embodiment mode, as shown in FIG. 4B, the first insulation film 102, the island-like crystalline semiconductor film 104, and the second insulation film 105 are formed. Then, a p-type impurity for channel doping is introduced to the crystalline semiconductor film 104. In the process of forming the first insulation film 102, the first insulation film 102 may be formed to a thickness greater than that of the light-shielding film 400, and the surface of the first insulation film 102 may be polished to be levelled by using the well-known chemical-mechanical polishing (CMP) technique.

Figure 4C:
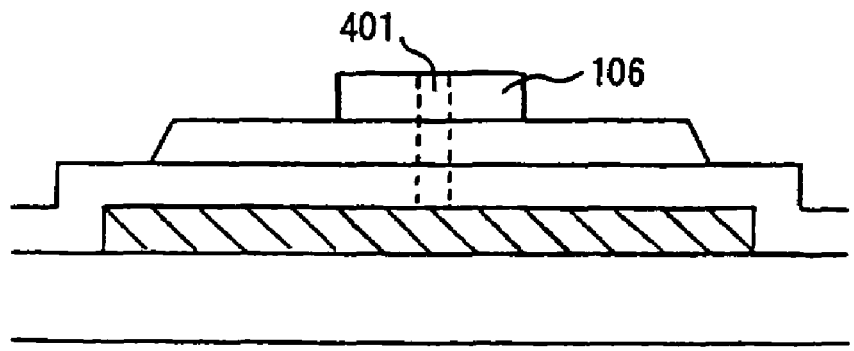

Subsequently, as shown in FIG. 4C, the second insulation film 105 and the first insulation film 102 are patterned using photolithography, and an opening 401 is formed. The opening 401 is formed to electrically connect a gate electrode 109 which will be formed later and the light-shielding film 400; the opening is not provided to the crystalline semiconductor film 104. When the light-shielding film 400 is not conductive, the opening 401 is not provided thereto. Next, the second insulation film 105 is patterned using photolithography, and an island-like second insulation film 106 is thereby formed.

Subsequent processes are similar to those in the first embodiment mode of present invention, that is, the processes may be performed as shown in FIGS. 1E and 2A to 2E. However, to form the oxide film 107, the hydrogen peroxide water as described in the third embodiment mode may be used. In addition, the conductive film 108 needs to be formed to completely fill up the opening 401. As described in the second embodiment mode, the conductive film 108 is formed of any one of, for example, copper, palladium, chromium, cobalt, titanium, molybdenum, niobium, tantalum, and tungsten. Further, the conductive film 108 is combined with, for example, titanium nitride, tantalum nitride, tungsten nitride, cobalt silicide, titanium silicide, molybdenum silicide, niobium silicide, tantalum silicide, or tungsten silicide. In this case, the crystalline silicon film containing the n-type impurity need not be used, and processes may be performed according to the processes in the second embodiment mode.

Hereinbelow, further practical embodiments relative to the embodiment modes of the present invention will be described.

(First Embodiment)

Figure 5A:
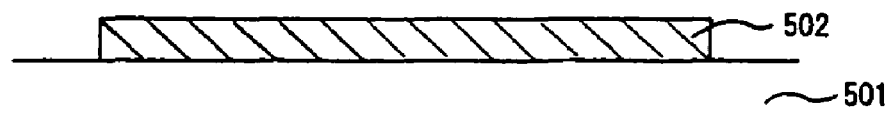
FIGS. 5A to 5E are cross-sectional views illustrative of a first example according to the present invention.

In a first embodiment, a manufacturing method for an active matrix liquid crystal display device (AMLCD) employing the first and fourth embodiment modes of the present invention will be described with reference to FIGS. 5A to 5E, 6A to 6E, and 7A to 7C. First, as shown in FIG. 5A, a crystalline silicon film and a tungsten silicide film are formed on a quartz substrate 501 by well-known techniques. In the present embodiment, the crystalline silicon film is formed according to an LPCVD method in which $SiH_4$ and $PH_3$ are used as source materials, and the deposition temperature is set to 600° C. Then, a target formed of tungsten and silicon is sputtered with argon ions, and the tungsten silicide film is thereby formed on the crystalline silicon film. The tungsten silicide film may be formed by other techniques, such as a CVD method using $WF_6$ and $SiH_2Cl_2$ as source materials. Then, the crystalline silicon film and the tungsten silicide film are patterned using photolithography, and a first light-shielding film 502 is thereby formed.

Figure 5B:
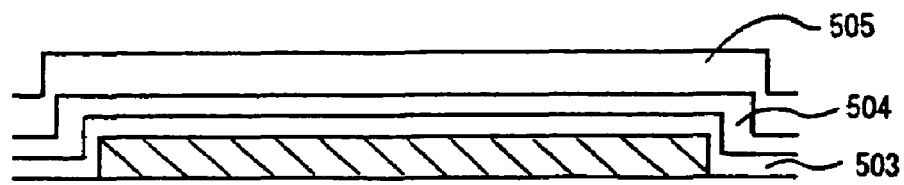

Subsequently, as shown in FIG. 5B, a silicon oxynitride film 503 is formed on the first light-shielding film 502 according to a plasma CVD method using $SiH_4$ and $N_2O$ as source materials. Further, a silicon oxide film 504 is formed on the first light-shielding film 502 by using an LPCVD method in which the deposition temperature is set to 800° C., and a reaction chamber is maintained in decompressed state. The silicon oxynitride film 503 is formed to prevent an LPCVD system, which is to be used to subsequently form the silicon oxide film 504, from being contaminated by materials forming the first light-shielding film 502. Therefore, if no probability exists that the LPCVD system is contaminated, the silicon oxynitride film 503 need not be formed. The silicon oxynitride film 503 and the silicon oxide film 504 correspond to the first insulation film 102 in the first and fourth embodiment modes, respectively. Subsequently, a silicon film 505 is formed by an LPCVD method on the silicon oxide film 504.

Next, the quartz substrate 501 is rotated, while being coated with solution containing nickel as an element accelerates crystallization of silicon films, specifically, nickel acetate solution in the present embodiment by using a spin coating technique. Then, while the quartz substrate 501 is rotated, an excessive amount of the nickel acetate solution is removed to dry the substrate. Subsequently, heat treatment is conducted using an electric furnace at a temperature of 450° C. for one hour to cause hydrogen contained in the silicon film 505 to be released. In addition, heat treatment is conducted using an electric furnace at a temperature of 600° C. for 12 hours to cause the silicon film 505 to be crystallized.

As an alternative method of crystallizing the silicon film 505, the method described hereunder may be used. Solid-state laser light formed in a rectangular form (second harmonic (532 nm) of an Nd:$YVO_4$ laser) is irradiated to the silicon film 505. The light having a 532 nm wavelength has a characteristic in that it is not substantially absorbed into the quartz substrate 501, while it is absorbed into the silicon film 505. Therefore, the time required for crystallization of a silicon film can be more reduced by using laser irradiation than by heating the film in an electric furnace. In this case, the step of applying the nickel-contained solution as well as a gettering step described below can be omitted from the manufacturing procedure.

Figure 5C:
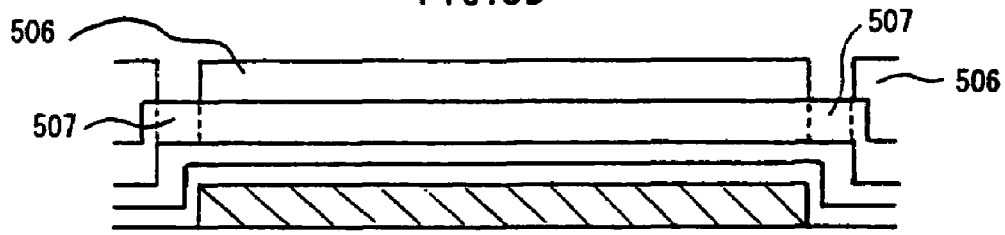

Subsequently, nickel contained in the crystallized silicon film 505 needs to be gettered to thereby be removed. First, a silicon oxide film is formed on the crystallized silicon film 505 by using an LPCVD method in which the deposition temperature is set to 400° C. Then, the film thus formed is patterned using photolithography, and a mask 506 as shown in FIG. 5C is thereby formed. The mask 506 is formed to introduce phosphorous to only a portion of the crystallized silicon film 505.

Next, phosphorous is introduced from the mask 506 to the crystallized silicon film 505 according to an ion-doping method under a condition of 10 kV and $2 \times 10^{15}$ cm$^{-2}$. As a result, the phosphorous is introduced to a region 507. Thereafter, upon heating of the crystallized silicon film 505 at a temperature of 700° C. for 12 hours in a nitrogen ambient, nickel in the crystallized silicon film 505 transfers to the region 507.

Figure 5D:
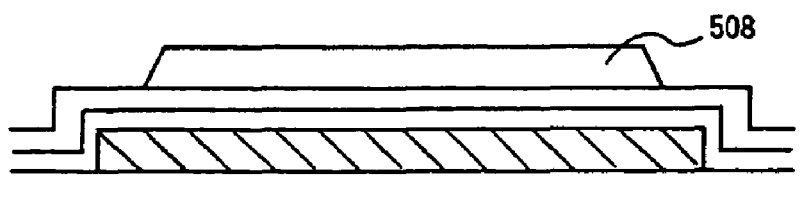

Subsequently, as shown in FIG. 5D, the mask 506 is etched and removed, and in addition, the crystallized silicon film 505 is patterned using photolithography. Thereby, an island-like crystalline silicon film 508 is formed. In this state, the region 507 is totally removed. In addition, the crystalline silicon film 508 is formed to completely overlap the first light-shielding film 502.

Figure 5E:
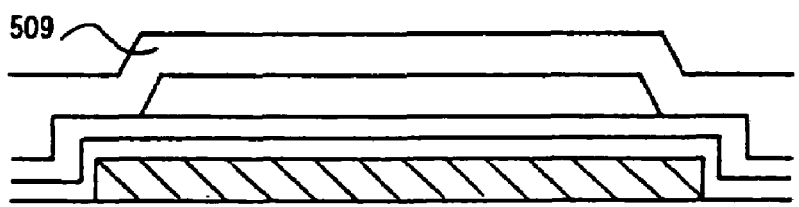

Next, as shown in FIG. 5E, a silicon oxynitride film 509 is formed by a plasma CVD method in which $SiH_4$ and $N_2O$ are used as source materials. Then, channel doping is performed by introducing boron under a condition of 60 kV and $3.6 \times 10^{13}$ cm$^{-2}$ to the entirety of the crystalline silicon film 508.

Figure 6A:
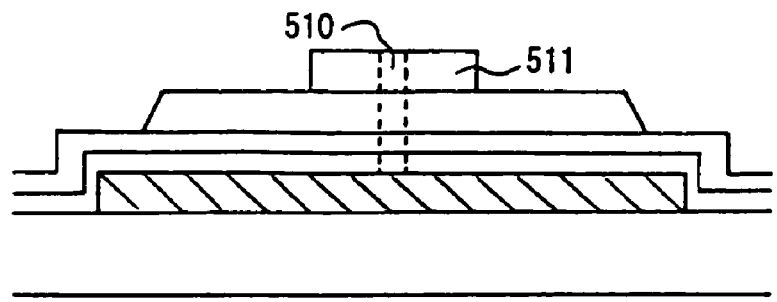
FIGS. 6A to 6D are cross-sectional views illustrative of the first example according to the present invention.

Subsequently, as shown in FIG. 6A, patterning is performed using photolithography to form an opening 510 through the silicon oxynitride film 503, the silicon oxide film 504, and the silicon oxynitride film 509 so as to reach the light-shielding film 502. The opening 510 is not formed for the crystalline silicon film 508. Then, the silicon oxynitride film 509 is patterned using photolithography, and an island-like gate insulation film 511 is thereby formed.

Figure 6B:
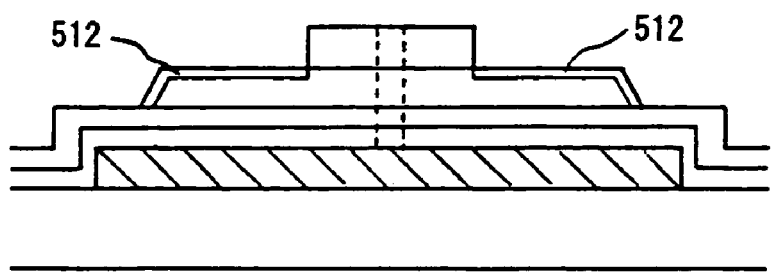

Next, as shown in FIG. 6B, an island-like silicon oxide film 512 is formed on the surface of the crystalline silicon film 508. The silicon oxide film 512 is formed by the method described in the first embodiment mode of the present invention. Specifically, native oxides are removed by dilute hydrofluoric acid water solution from the surface of crystalline silicon film 508 whose surface has been exposed when forming the gate insulation film 511. Then, a spin coating technique is performed. In the coating process, the quartz substrate 501 on which the first light-shielding film 502, the silicon oxynitride film 503, the silicon oxide film 504, the crystalline silicon film 508, and the gate insulation film 511 are formed is rotated. At the same time, ozone water having a density of 14 mg/l is applied to continually flow to the surface of the crystalline silicon film 508 at a room temperature for a time period of 60 seconds. Thereafter, the surface is washed with the deionized water, and the ozone water is thereby removed from the surface. Then, while nitrogen is sprayed, the substrate 501 is rotated, and the surface is dried. As a result, the formed silicon oxide film 512 contains $Si^{1+}$, $Si^{2+}$, $Si^{3+}$, and $Si^{4+}$. In other words, the film 512 contains $SiO_x$ (0<X<2) and $SiO_2$.

Figure 6C:
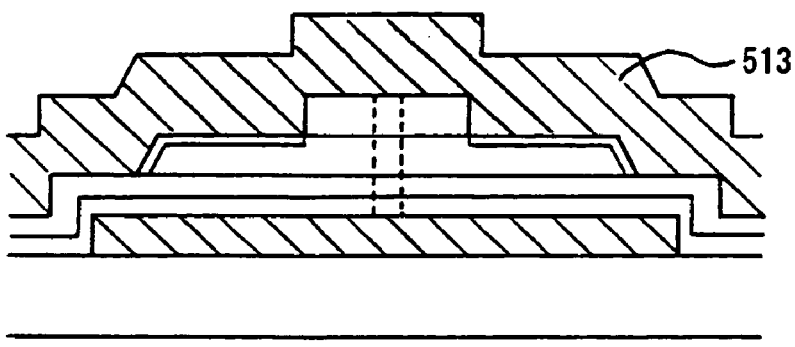

Subsequently, as shown in FIG. 6C, a phosphorous-containing crystalline silicon film 513 is formed on the silicon oxide film 504, the silicon oxide film 512, and the gate insulation film 511 according to an LPCVD method in which $SiH_4$ and $PH_3$ are used as source materials, and the deposition temperature is set to 600° C.

Figure 6D:
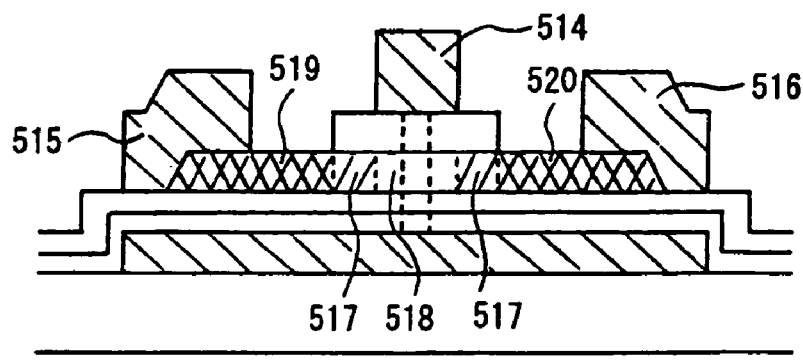

Next, as shown in FIG. 6D, the phosphorous-containing crystalline silicon film 513 is patterned using photolithography, thereby, a gate electrode 514, a source electrode 515, and a drain electrode 516 are simultaneously formed. As an etching process in the patterning, wet etching using alkaline solution is employed. In this case, the oxide film 512 operates as an etch stop, thereby causing the crystalline silicon film 508 to remain unetched.

Subsequently, phosphorous is introduced to the crystalline silicon film 508 by using an ion doping method. First, phosphorous is introduced to a region covered by only the gate insulation film 511 in the crystalline silicon film 508 under a condition of 60 kV and $5 \times 10^{13}$ cm$^{-2}$ in order to form low-density impurity regions 517 (LDD regions). Then, the phosphorous is introduced to a region covered by only the silicon oxide film 512 in the crystalline silicon film 508 under a condition of 50 kV and $2 \times 10^{15}$ cm$^{-2}$ in order to form a source region 519 and a drain region 520. The phosphorous is not introduced to a region that is located below the gate electrode 514 and that is sandwiched by the low-density impurity regions 517 (LDD regions), and the region is used as a channel region 518. After the gate insulation film 511 has been formed and before the silicon oxide film 512 is formed, the phosphorous may be introduced to the crystalline silicon film 508 to form the source region 519 and the drain region 520. This obviates the necessity of the phosphorous introduction step that is performed after the formation of the low-density impurity regions 517 (LDD regions) in order to form the source region 519 and the drain region 520.

After the phosphorous has been introduced in the above-described manner, the silicon oxide film 512 still exists between the portion where the source region 519 and the source electrode 515 are formed and the portion where the drain region 520 and the drain electrode 516 are formed. In addition, the phosphorous having a density sufficient enough to form a source region and a drain region is not introduced to the portion covered by the drain electrode 516 in the source region 519 and to the portion covered by the drain electrode 516 in the drain region 520. Therefore, using an electric furnace, the quartz substrate 501 on which at least the crystalline silicon film 508, the silicon oxide film 512, the source electrode 515, and the drain electrode 516 are formed is heated at a temperature of 950° C. for a time period of 30 minutes in a nitrogen ambient, thereby, the phosphorous is dispersed from the source electrode 515 and the drain electrode 516 to the source region 519 and the drain region 520. The heating therefore works to reduce the contact resistance between the source region 519 and the source electrode 515 and the contact resistance between the drain region 520 and the drain electrode 516.

Figure 7A:
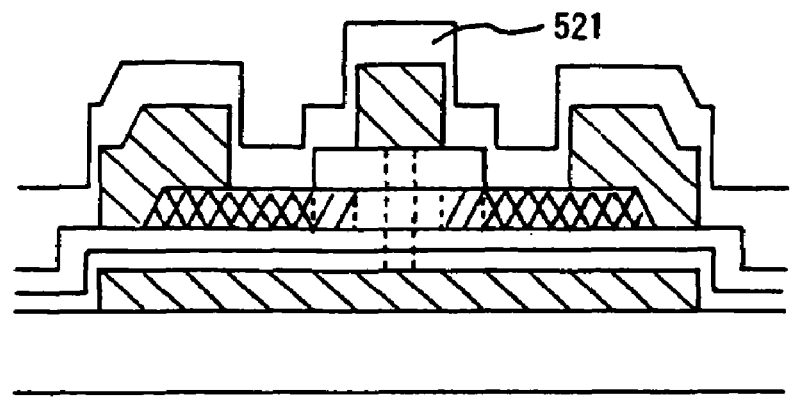
FIGS. 7A to 7C are cross-sectional views illustrative of the first example according to the present invention.

Next, as shown in FIG. 7A, a silicon oxynitride film is formed by a plasma CVD method in which $SiH_4$ and $N_2O$ are used as source materials, and the formed film is used as an interlayer insulation film 521. Thereafter, heating is performed at a temperature of 950° C. for a time period of 30 minutes in a nitrogen ambient to activate the n-type impurity contained in each of the crystalline silicon film 508, the gate electrode 514, the source electrode 515, and the drain electrode 516. Then, heating is performed at a temperature of 350° C. for one hour in a hydrogen ambient. As a result, hydrogen terminates dangling bonds (class of defects) in the silicon used to form the crystalline silicon film 508, the gate electrode 514, the source electrode 515, and the drain electrode 516.

Figure 7B:
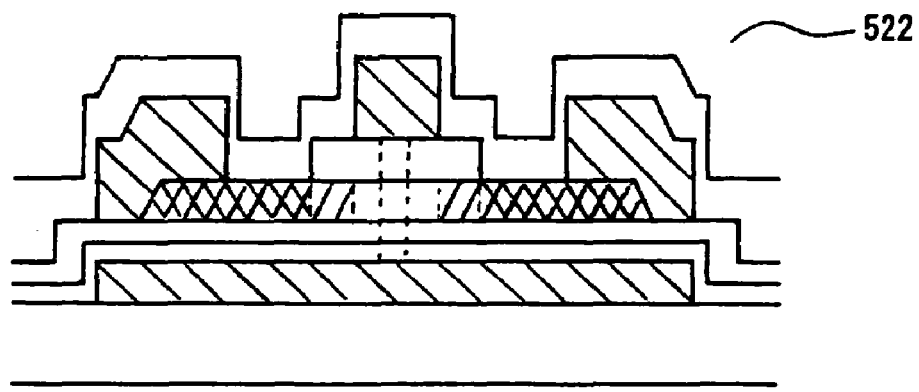

Subsequently, as shown in FIG. 7B, an acrylic resin film is formed as a planarizing film 522 on the interlayer insulation film 521. Instead of the planarizing film 522, the film may be, for example, a polyimide resin film, a benzocyclobutene (BCB) film, or a silicon oxide film formed using a coating technique (SOG technique).

Figure 7C:
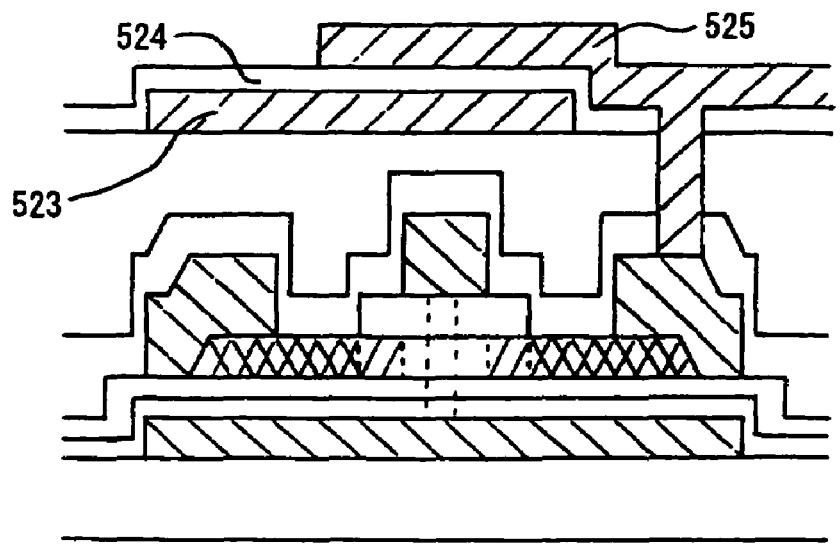

Next, as shown in FIG. 7C, an aluminum-titanium alloy film is formed using a sputtering process and is then patterned using photolithography to form a second light-shielding film 523. In the present embodiment, to form a film having light-shielding effects and electroconductivity for the second light-shielding film 523, the film may be formed of metal, such as chromium, a conductive polymeric material (polymeric material that exhibits electroconductivity), or a conductive resin (resin mixed with a conductive material such as metal and carbon) instead of the aluminum-titanium alloy. To form an insulation film 524 on the second light-shielding film 523, a silicon nitride oxide film is formed using a plasma CVD method in which $SiH_4$, $N_2O$, and $NH_3$ are used as source materials. Then, the interlayer insulation film 521, the planarizing film 522, and the insulation film 524 are patterned using photolithography, and an opening is formed so as to reach the drain electrode 516 (or the source electrode 515). Next, a transparent conductive film is formed of ITO on the insulation film 524, and the formed film is then patterned. In this manner, a pixel electrode 525 is formed. In the present embodiment, the transparent conductive film may be formed using a compound of indium oxide and zinc oxide instead of using the ITO.

As is apparent from FIG. 7C, a capacitor is formed by the second light-shielding film 523, which is the conductive film, the pixel electrode 525, and the insulation film 524 formed therebetween.

The processes described above partially complete the manufacturing method up to the stage where pixel electrodes of the active matrix liquid crystal display device are formed on the substrate on the side where thin-film transistors are formed. Thereafter, the liquid crystal display device may be completed employing well-known techniques.

(Second Embodiment)

A second embodiment is described to disclose another technique of gettering the nickel contained in the crystallized silicon film 505 described in the first embodiment of the present invention. Only matters dissimilar to those discussed in the first embodiment will be described hereunder.

This embodiment is similar to the first embodiment of the invention in processing up to the state where the nickel acetate solution is applied to the crystallized silicon film 505 shown in FIG. 5B, and the crystallized silicon film 505 is heated and crystallized.

Figure 8A:
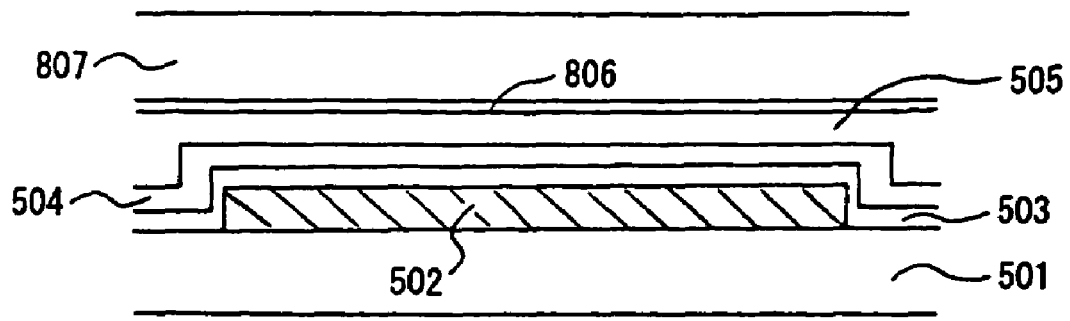
FIGS. 8A to 8D are cross-sectional views illustrative of a second example according to the present invention.

After the above state, native oxides are removed with the dilute hydrofluoric acid solution from the surface of the crystallized silicon film 505, and an oxide film 806 as shown in FIG. 8A is formed by use of ozone water in the manner similar to that in the first embodiment of the invention. Then, an amorphous silicon film 807 is formed on a silicon oxide film 806 by use of an LPCVD method. Thereby, argon, which is a noble gas element, is thereby introduced to the amorphous silicon film 807. For the introduction, instead of the argon, any one of helium, neon, krypton, and xenon may be used.

Subsequently, heating is conducted at a temperature of 550° C. for four hours in an electric furnace. Because of the heating, the nickel contained in the crystallized silicon film 505 passes through the silicon oxide film 806 and transfers to the amorphous silicon film 807 to which the argon has been introduced. Thereby, the nickel is gettered. The heating temperature may be 550° C. or higher, and the upper limit of the heating temperature is determined depending on the performance of a furnace and a substrate that are used. In addition, an increase in the heating temperature enables the gettering even in a heating time shorter than four hours.

Next, the amorphous silicon film 807 is removed in a wet etching process using alkaline solution. In the wet etching process, since the silicon oxide film 806 operates as an etch stop, the crystallized silicon film 505 remains unetched. Consequently, the density of the nickel in the crystallized silicon film 505 can be reduced to a level of $1 \times 10^{17}$ cm$^{-3}$ or lower.

Figure 8B:
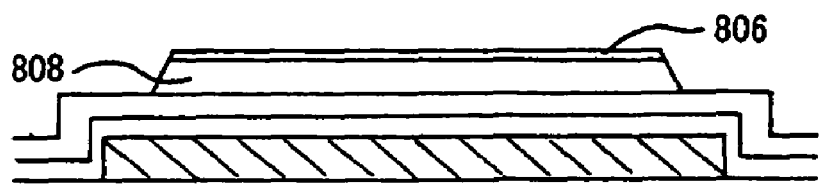

Subsequently, as shown in FIG. 8B, the crystallized silicon film 505 is patterned using photolithography, and an island-like crystalline silicon film 808 is thereby formed. The silicon oxide film 806 remains on only the upper surface of the crystalline silicon film 808, whereas it does not remain on sidewalls thereof.

Figure 8C:
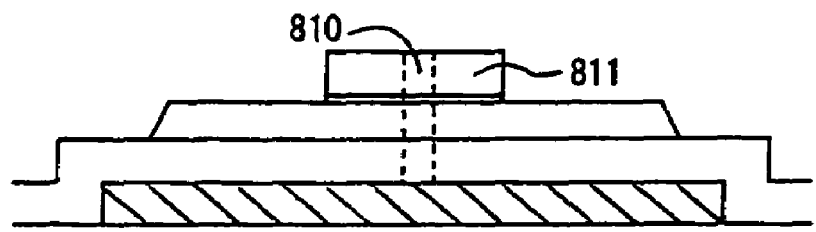
Figure 8D:
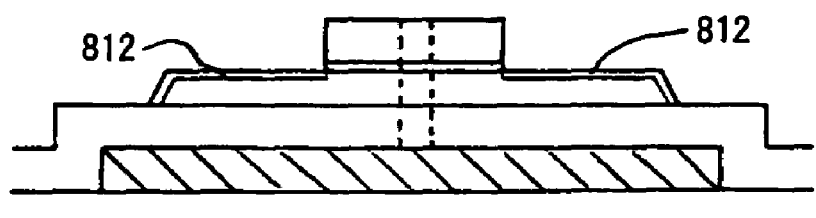

Next, as shown in FIG. 8C, an opening 810 and a gate insulation film 811 are formed in a manner similar to that in the first embodiment of the present invention. When forming the island-like gate insulation film 811 by performing patterning, a portion of the silicon oxide film 806 that is not covered by the gate insulation film 811 is etched. Therefore, the ozone water is used again, and a silicon oxide film 812 as shown in FIG. 8D is formed in a manner similar to that in the first embodiment of the present invention.

Since subsequent processes are similar to those in the first embodiment of present invention, the processes may be performed as shown in FIGS. 6C, 6D, and 7A to 7C.

(Third Embodiment)

A second embodiment is described to disclose an active matrix display device that uses LEDs (light emitting devices) and that is manufactured employing the first and second embodiments of the present invention.

Figure 9:
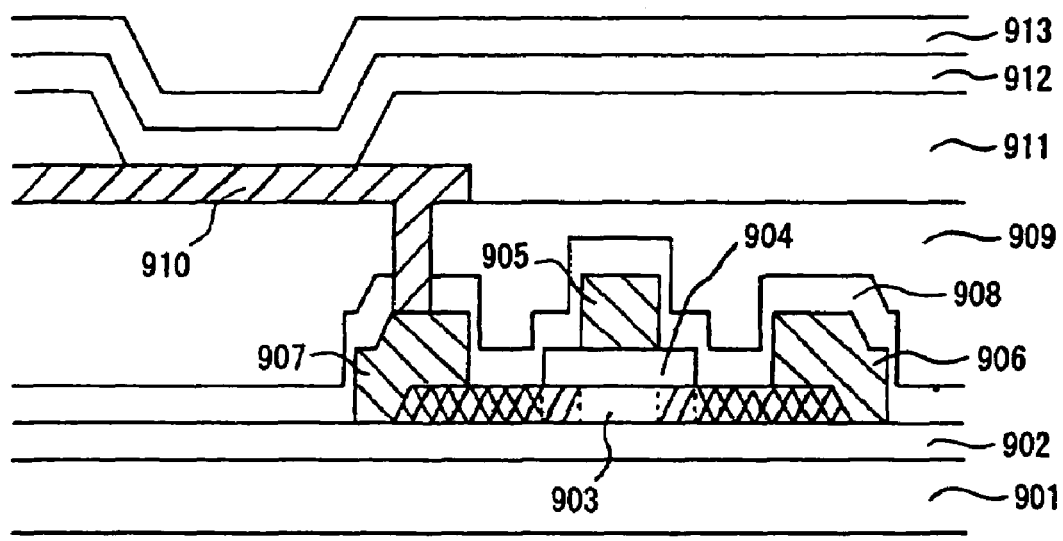
FIG. 9 is a cross-sectional view of a third example according to the present invention.

FIG. 9 is a cross-sectional view of a pixel portion of the display device. Ordinarily, one switching thin-film transistor connected to a gate signal line and a source signal line and one current-controlling thin-film transistor (also called a "driving thin-film transistor") connected to an LED are provided in units of one pixel. However, FIG. 9 shows only the current-controlling thin-film transistor. Although the driving thin-film transistor may be either a p-channel thin-film transistor or an n-channel thin-film transistor, the p-channel thin-film transistor is used in the present embodiment.

The pixel portion includes a first insulation film 902, an island-like crystalline silicon film 903, an island-like gate insulation film 904 (second insulation film), a gate electrode 905, a source electrode 906, and a drain electrode 907 on a quartz substrate 901. The gate electrode 905, the source electrode 906, and the drain electrode 907 are formed on a same conductive material. The island-like crystalline silicon film 903 includes a source region, a drain region, and low-density impurity regions (LDD regions) that contain boron as p-type impurity. In addition, the crystalline silicon film 903 includes SiO$_x$ (0<X<2) (not shown) between the source electrode 906 and the source region and between the drain electrode 907 and the drain region. SiO$_x$ (0<X<2) may be provided either in the form of a film or not in the form of a film.

In addition, the pixel portion includes a third insulation film 908 and a planarizing film 909 that are provided in such a manner as to cover the gate electrode 905, the source electrode 906, and the drain electrode 907. Further included therein are an anode 910 that is formed of a transparent conductive film (ITO) having a large work function and that is connected to the drain electrode 907; and a fourth insulation film 911 formed on the anode 910. The fourth insulation film 911 has an opening to cause a portion of the surface of the anode 910 to be exposed.

Further, the pixel portion includes an organic compound film 912 that is formed in contact with the anode 910 on the fourth insulation film 911 and that includes a luminescent element, and a cathode 913 formed of either a metal or an alloy (Mg—Ag alloy) that has a small work function. The anode 910, the organic compound film 912 including the luminescent element, and the cathode 913 together forms the LED. The active matrix display device using the LEDs according to the present embodiment is of a downward-radiation type in which light is radiated from the LEDs to the quartz substrate 901.

(Fourth Embodiment)

In a fourth embodiment, various example products each including a display device of the type manufactured according to the present invention will be enumerated. The display device is one of an active matrix liquid crystal display device and an active matrix display device using LEDs.

Although not illustrated in the drawings, the display device manufactured according to the present invention is used for a display device section of one of various electronic devices, such as a notebook personal computer, a cellular phone, a digital camera, a video camera, a personal digital assistant (PDA), a TV set, a car navigation system, and a head-mounted display device. In addition, the present invention is used for a display device built into either a front-end projector or a rear-end projector.

The present invention is based on attention paid to an oxide film that is formed through a process of a semiconductor surface by use of ozone water or hydrogen peroxide water. By using the oxide film as an etch stop, the gate electrode, the source electrode, and the drain electrode of a field-effect transistor can be simultaneously formed using a single photomask in a single patterning step. Therefore, the interface pitch between the gate electrode and the source electrode and the interface pitch between the gate electrode and the drain electrode can be reduced as much as possible. Concurrently, the area where the source electrode covers a source region and the area where the drain electrode covers a drain region can easily be changed. In addition, the present invention obviates the necessity of performing patterning for providing an opening to an interlayer insulation film to couple the source electrode to the source region and to couple the drain electrode to the drain region. After the gate electrode, the source electrode, and the drain electrode have been formed, heating is performed at a high temperature of 800° C. or higher for a predetermined time. As a result, even while the aforementioned oxide film remains, the electrical conductivity between the source electrode and the source region and the electrical conductivity between the drain electrode and the drain region can be sufficiently maintained.

According to the present invention, the number of patterning steps and the number of photomasks can be reduced. Further, the throughput and the yield can be improved. Furthermore, either an active matrix liquid crystal display device or a LED-using active matrix display device according to the present invention can be applied to a display device section of an electronic device or to one of a variety of products that includes a built-in electronic device.

Although the present embodiments have disclosed a thin-film transistor, the present invention is not limited to the thin-film transistor. The present invention can be also apply to the bulk-type IGFET (Insulated-Gate Field Effect Transistor) which is formed on the silicon substrate.

What is claimed is:

1. A manufacturing method for a field-effect transistor, comprising:
    forming a first insulation film over a crystalline semiconductor;
    forming a gate insulation film over a portion of the crystalline semiconductor by patterning the first insulation film;
    introducing an impurity having one conductivity type to the crystalline semiconductor by using the gate insulation film as a mask;
    forming an oxide film by oxidizing a surface of the crystalline semiconductor by using an oxidizing water solution;
    forming a conductive film on the oxide film and the gate insulation film;
    simultaneously forming a gate electrode, a source electrode, a drain electrode by patterning the conductive film;
    introducing an impurity having one conductivity type to the crystalline semiconductor by using the gate electrode, the source electrode, and the drain electrode as masks; and
    heating the crystalline semiconductor, the oxide film, the gate insulation film, the gate electrode, the source electrode, and the drain electrode in an inert gas ambient at a temperature of from 800° C. to 1050° C. for a time period of from 30 minutes to 4 hours.

2. A manufacturing method for a field-effect transistor according to claim 1, wherein the oxidizing water solution is one of ozone water solution and hydrogen peroxide water solution.

3. A manufacturing method for a field-effect transistor according to claim 1, wherein said one conductivity is a n-type conductivity.

4. A manufacturing method for a field-effect transistor according to claim 1, wherein said one conductivity is a p-type conductivity.

5. A manufacturing method for a field-effect transistor, comprising:
    forming a semiconductor film over a substrate;
    forming a crystalline semiconductor film by crystallizing the semiconductor film;
    forming an island-like crystalline semiconductor film by patterning the crystalline semiconductor film;
    forming a first insulation film over the island-like crystalline semiconductor film;
    forming a gate insulation film over the island-like crystalline semiconductor film by patterning the first insulation film;
    introducing an impurity having one conductivity type to the island-like crystalline semiconductor by using the gate insulation film as a mask;
    forming an oxide film by oxidizing a surface of the island-like crystalline semiconductor film by using an oxidizing water solution;
    forming a conductive film over the substrate and over the oxide film and the gate insulation film;
    simultaneously forming a gate electrode, a source electrode, a drain electrode by patterning the conductive film;
    introducing an impurity having one conductivity type to the island-like crystalline semiconductor film by using the gate electrode, the source electrode, and the drain electrode as masks; and
    heating the substrate having at least the island-like crystalline semiconductor film, the oxide film, the gate insulation film, the gate electrode, the source electrode, and the drain electrode formed thereon, in an inert gas ambient at a temperature of from 800° C. to 1050° C. for a time period of from 30 minutes to 4 hours.

6. A manufacturing method for a field-effect transistor according to claim 5, wherein the substrate is a quartz substrate.

7. A manufacturing method for a field-effect transistor according to claim 5, wherein the oxidizing water solution is one of ozone water solution and hydrogen peroxide water solution.

8. A manufacturing method for a field-effect transistor according to claim 5, wherein said one conductivity is a n-type conductivity.

9. A manufacturing method for a field-effect transistor according to claim 5, wherein said one conductivity is a p-type conductivity.

10. A manufacturing method for a field-effect transistor, comprising:
    forming a first insulation film over a crystalline semiconductor;
    forming a gate insulation film over a portion of the crystalline semiconductor by patterning the first insulation film;
    introducing an impurity having one conductivity type to the crystalline semiconductor by using the gate insulation film as a mask;
    forming an oxide film by oxidizing a surface of the crystalline semiconductor by using an oxidizing water solution;
    forming a conductive film on the oxide film and the gate insulation film;
    simultaneously forming a gate electrode, a source electrode, a drain electrode by patterning the conductive film;
    introducing an impurity having one conductivity type to the crystalline semiconductor by using the gate electrode, the source electrode, and the drain electrode as masks; and
    heating the crystalline semiconductor, the oxide film, the gate insulation film, the gate electrode, the source electrode, and the drain electrode in order to reduce a contact resistance between the crystalline semiconductor and the source electrode and the drain electrode.

11. A manufacturing method for a field-effect transistor according to claim 10, wherein the oxidizing water solution is one of ozone water solution and hydrogen peroxide water solution.

12. A manufacturing method for a field-effect transistor according to claim 10, wherein said one conductivity is a n-type conductivity.

13. A manufacturing method for a field-effect transistor according to claim 10, wherein said one conductivity is a p-type conductivity.

14. A manufacturing method for a field-effect transistor according to claim 10, wherein the crystalline semiconductor, the oxide film, the gate insulation film, the gate electrode, the source electrode, and the drain electrode are heated in an inert gas ambient.

* * * * *